(12) United States Patent
Gompf et al.

(10) Patent No.: US 6,518,765 B1
(45) Date of Patent: Feb. 11, 2003

(54) MULTI-SENSOR ELECTROMETER

(75) Inventors: Raymond Gompf, Merritt Island, FL (US); Martin C. Buehler, La Canada, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/575,828

(22) Filed: May 18, 2000

Related U.S. Application Data

(60) Provisional application No. 60/135,243, filed on May 21, 1999.

(51) Int. Cl.[7] ............................................. G01R 27/26
(52) U.S. Cl. ................................. 324/454; 324/452
(58) Field of Search ........................... 324/454, 458, 324/449, 457, 452; 430/137.13, 20, 121

(56) References Cited

U.S. PATENT DOCUMENTS

| | | | | |
|---|---|---|---|---|
| 2,618,552 A | * | 11/1952 | Wise et al. ................. | 430/121 |
| 2,934,649 A | * | 4/1960 | Walkup ....................... | 250/649 |
| 3,873,356 A | * | 3/1975 | Queener et al. ........ | 430/137.13 |
| 3,907,559 A | * | 9/1975 | Goffe ......................... | 430/20 |
| 3,922,382 A | * | 11/1975 | Kukla et al. ........... | 430/137.13 |
| 4,256,402 A | * | 3/1981 | Nishikawa .................... | 399/58 |
| 5,341,103 A | * | 8/1994 | Dasgupta et al. ........... | 324/452 |
| 5,608,326 A | * | 3/1997 | Mucci et al. ................ | 324/452 |

* cited by examiner

*Primary Examiner*—Christine Oda
*Assistant Examiner*—Vincent Q. Nguyen
(74) *Attorney, Agent, or Firm*—Fish & Richardson P.C.

(57) ABSTRACT

An array of triboelectric sensors is used for testing the electrostatic properties of a remote environment. The sensors may be mounted in the heel of a robot arm scoop. To determine the triboelectric properties of a planet surface, the robot arm scoop may be rubbed on the soil of the planet and the triboelectrically developed charge measured. By having an array of sensors, different insulating materials may be measured simultaneously. The insulating materials may be selected so their triboelectric properties cover a desired range. By mounting the sensor on a robot arm scoop, the measurements can be obtained during an unmanned mission.

6 Claims, 4 Drawing Sheets

MULTI-SENSOR ELECTROMETER

RELATED APPLICATION

This application claims the benefit of priority under 35 U.S.C. § 119(e) of U.S. Provisional Application No. 60/135, 243, filed May 21, 1999 which has been expired.

ORIGIN OF INVENTION

The invention described herein was made in the performance of work under a NASA contract, and is subject to the provisions of Public Law 96-517 (35 U.S.C. § 202) in which the Contractor has elected to retain title.

TECHNICAL FIELD

This invention relates to an electrometer, and more particularly to an electrometer having a triboelectric field sensor array to evaluate the electrostatic nature of a region.

BACKGROUND

During space exploration, there are many hazards that a human may encounter. By collecting as much information as possible about the environment to be explored, the hazards can be reduced. Prior to human exploration, probes and test equipment is sent into the environment to collect data. This data may then be used to enhance the safety of human exploration.

One hazard that may exist in space is the build-up of static electricity. For example, an astronaut walking on the surface of a planet such as Mars may produce static electricity. If enough static electricity is developed, problems may occur. To prevent the build-up of static electricity, antistatic materials may be used in the manufacturing of space suits and any other objects that may interface with the environment. However, the behavior of antistatic materials in different environments may be unpredictable. To better predict the behavior of a particular material, it is desirable to have empirical data showing the triboelectric properties of materials in the space environment.

SUMMARY

The present invention provides an array of triboelectric sensors for testing in a remote environment. The sensors may be mounted in the heel of a robot arm scoop. To determine the triboelectric properties of a planet surface, the robot arm scoop may be rubbed on the soil of the planet and the triboelectrically developed charge measured. By having an array of sensors, different insulating materials may be measured simultaneously. The insulating materials may be selected so their triboelectric properties cover a desired range. By mounting the sensor on a robot arm scoop, the measurements can be obtained during an unmanned mission.

One aspect of the invention is a method of determining the triboelectric properties of a material. The method comprises selecting a plurality of insulators and simultaneously rubbing the plurality of insulators against the material. The method then measures the change in electrical charge of the insulators.

Another aspect of the invention is an electrometer comprising a sensor array. The sensor array includes a plurality of triboelectronic sensors, each including a plurality of insulators. The insulators are selected based on the triboelectronic properties of each insulators.

DESCRIPTION OF DRAWINGS

These and other features and advantages of the invention will become more apparent upon reading the following detailed description and upon reference to the accompanying drawings.

DETAILED DESCRIPTION

Figure 1:
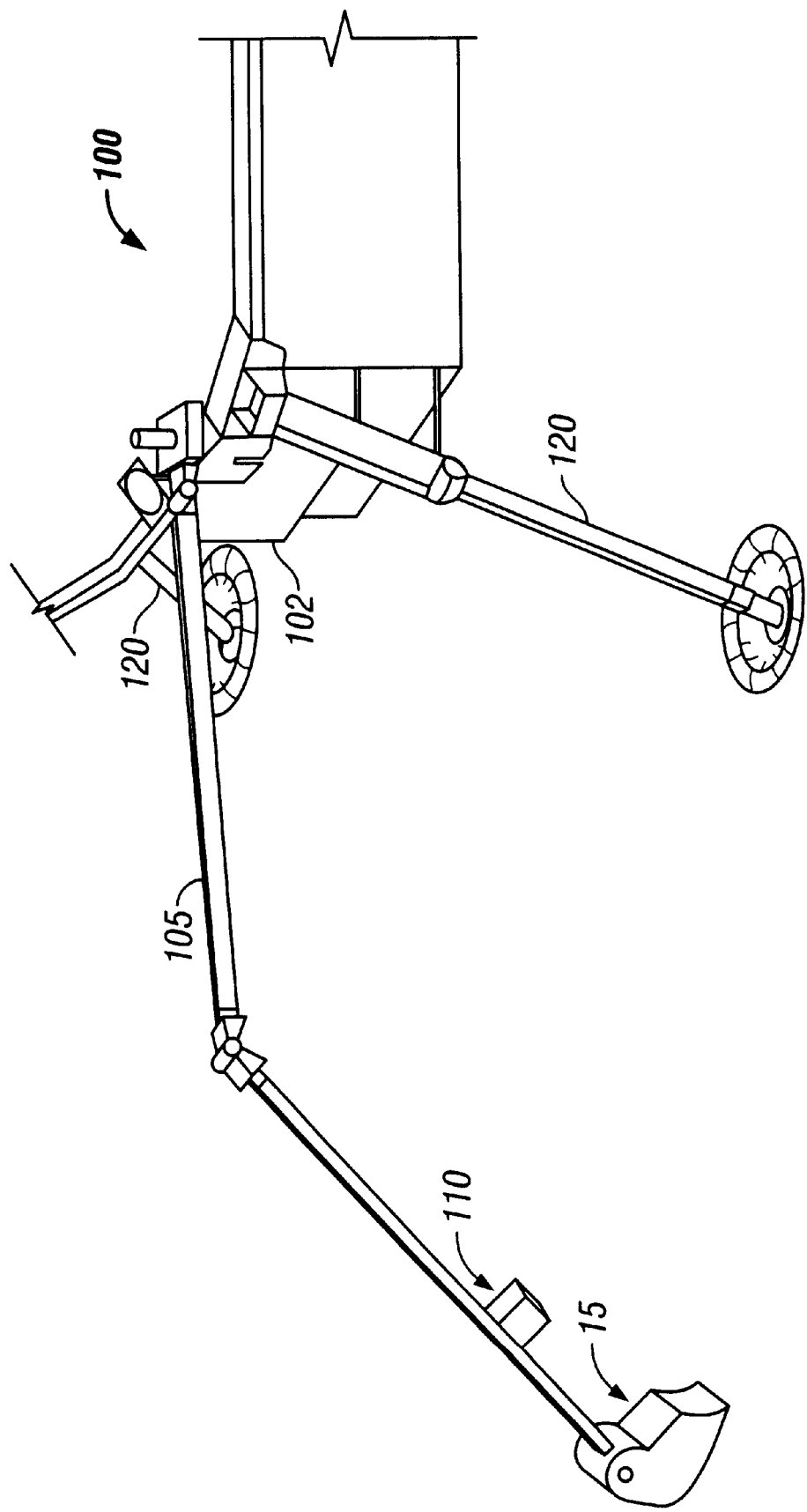
FIG. 1 illustrates a robotic arm including a electrometer according to an embodiment of the present invention.

FIG. 1 illustrates a robot 100 designed to operate in remote environments, including other planets such as Mars. The robot 100 may be operated from a base station on Earth. This allows the collection of data in a remote and hostile environment such as Mars without exposing people to the dangers involved with space travel. Data collected by the robot allows for a better understanding of the hazards related to the human exploration of these remote environments.

One hazard that may exist is the electrostatic nature of a remote environment. When a person explores a planet surface such as Mars, there is the possibility that the interaction between the person and the planet surface may cause a build-up of static electricity, which may be harmful to people and equipment. To reduce the build-up of static electricity, the nature of the environment may be tested. Based on the results of these tests, materials that may come in contact with the environment may be selected to reduce the build-up of static electricity.

The robot 100 includes a body 102 having legs 120 to provide stability. A moveable arm 105 extends from the robot 100 to provide for data collection. An electrometer 115 is attached to the heel of the arm 105. A camera 110 may also be attached to the arm 105 to provide a visual guide for the electrometer 115. The electrometer 115 may be dragged along the surface of the remote environment to collect data.

Figure 2:
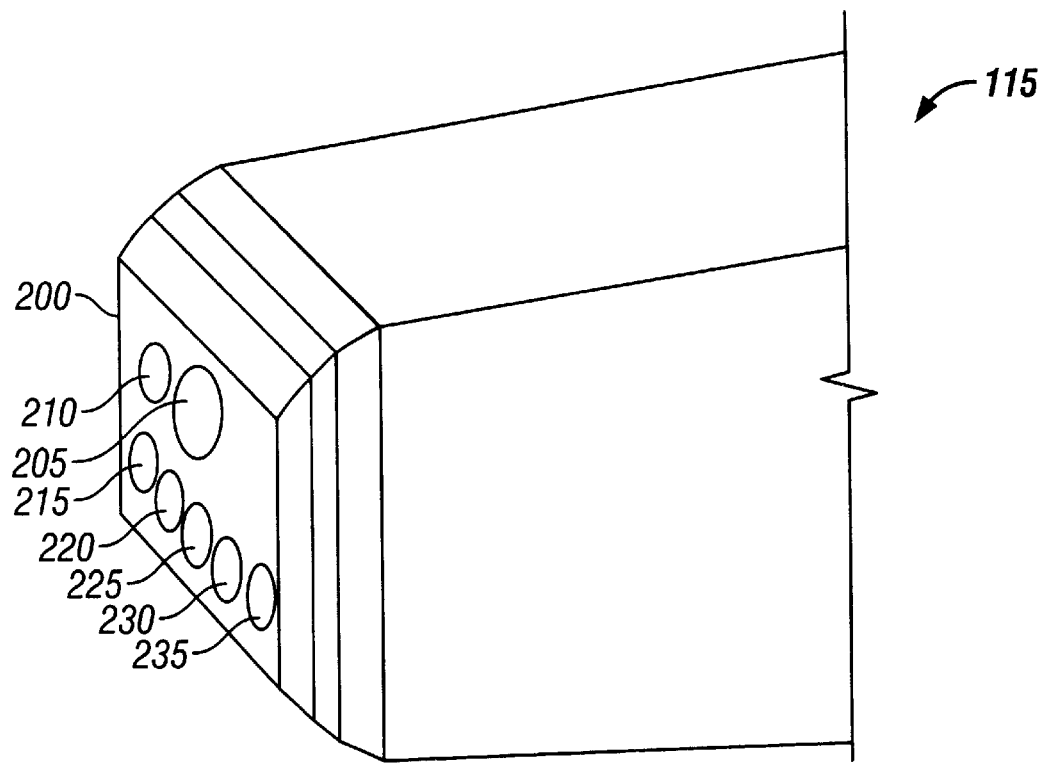
FIG. 2 illustrates the heel of the robotic arm scoop of FIG. 1 housing the electrometer according to an embodiment of the present invention.

FIG. 2 illustrates the heel 200 of the robotic arm 105 of FIG. 1. The heel 200 houses the electrometer 115 according to an embodiment of the present invention. The electrometer 115 includes a variety of sensors to collect data. A temperature sensor (not shown) is housed within the electrometer 115. External sensors include a ion current sensor 205, an electric field sensor 210, and a plurality of triboelectric sensors 215, 220, 225, 230, and 235. The triboelectric sensors 215, 220, 225, 230, and 235 collectively form a sensor array. Although five sensors are shown and described, any plurality of sensors may be used without departing from the spirit of the invention.

Each of the triboelectric sensors 215, 220, 225, 230, and 235 consists of a different insulating material. Triboelectrification occurs when two different materials come in contact with each other. When two materials are rubbed together, one of the material becomes positively charged and the other takes on a negative charge. A triboelectic series may be used to predict the behavior of the materials. A sample triboelectric series is included as Table 1.

TABLE 1

| MATERIAL | CHARGE |
| --- | --- |
| Air | Positive |
| Human Hands | |
| Glass | |
| Mica | |
| Human Hair | |
| Nylon | |
| Wool | |
| Lead | |
| Aluminum | |
| Paper | |
| Cotton | Neutral |
| Steel | |
| Wood | |
| Hard Rubber | |
| Nickel & Copper | |
| Brass & Silver | |
| Gold & Platinum | |
| Acetate Rayon | |
| Polyester | |
| Polyurethane | |
| Polypropylene | |
| PVC | |
| Silicon | |
| Teflon | Negative |

Of course, the materials listed in Table 1 are just a sample of the thousands of materials available. Each triboelectric sensor 215, 220, 225, 230, and 235 includes one of the materials. Materials may be selected along the triboelectic series to provide data that may be extrapolated to all materials. In the case of space exploration, materials practical for use in devices such as gloves, visors, boots, and habitat materials may be selected.

Figure 3:
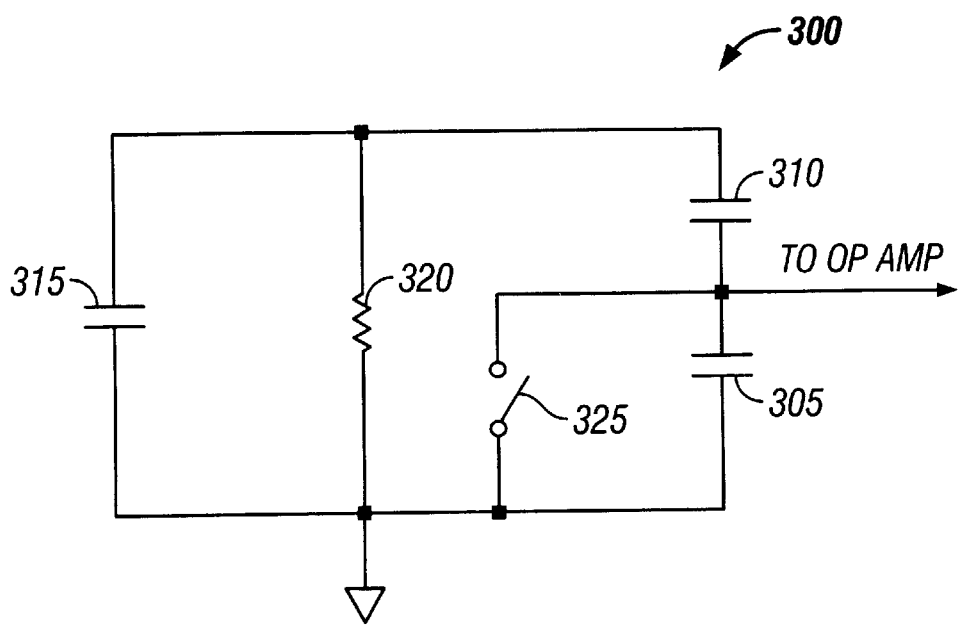
FIG. 3 is a schematic diagram of a circuit model for one sensor of the electrometer according to an embodiment of the present invention.

FIG. 3 is a schematic diagram of a circuit model for one sensor of a triboelectonic electrometer 300 according to an embodiment of the present invention. The triboelectonic electrometer 300 includes capacitors 305, 310, and 315, a resistor 320, and a switch 325. A first terminal of the capacitor 315 is connected to a first terminal of the resistor 320 and a first terminal of the capacitor 310. A second terminal of the capacitor 315 and a second terminal of the resistor 320 are connected to ground. The second terminal of the capacitor 310 is connected to the first terminal of the capacitor 305, to a first terminal of a switch 325, and to an operational amplifier. A second terminal of the capacitor 305 and a second terminal of the switch 325 are connected to ground.

The triboelectonic electrometer 300 is similar to the design of a traditional electrometer. In the triboelectonic electrometer 300, the switch 325 is typically a low-leakage solid state switch and is used to remove voltage from the capacitor 305. The capacitor 310 may be replaced by an insulator that is adapted to be rubbed against the test material to determine the potential build-up of charge. The resistor 320 functions as a discharge mechanism for the capacitor 310.

Figure 4:
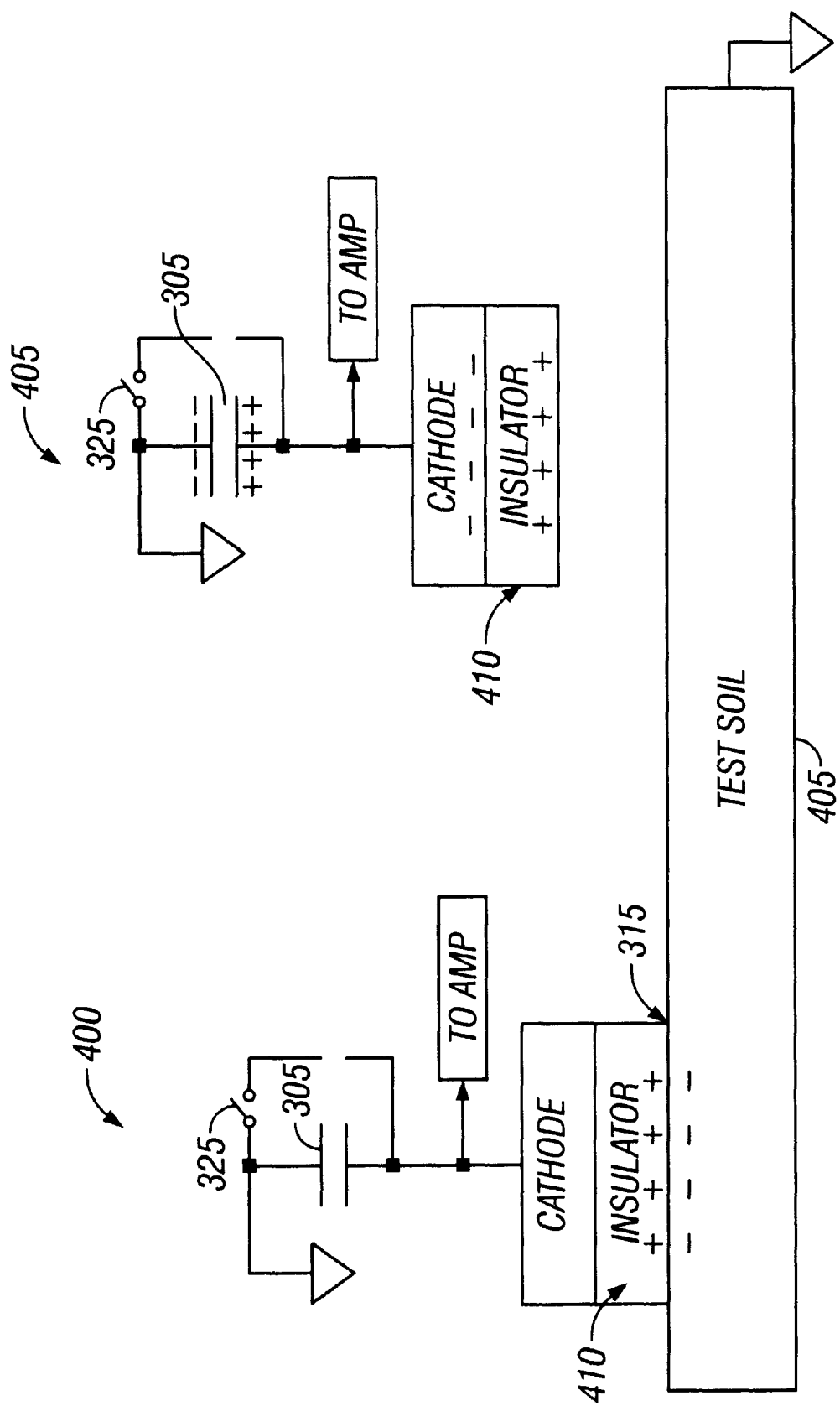
FIG. 4 is a block diagram of the operation of one sensor of the electrometer according to an embodiment of the present invention.

FIG. 4 is a block diagram of the operation of one sensor of the electrometer according to an embodiment of the present invention. At position 400, the sensor is in contact with the test soil 405 just prior to being rubbed against the test soil 405. The switch 325 has discharged the capacitor 305 and the insulator 410 includes a charge based on the material selected for the insulator. The sensor is then rubbed against the test soil 405 and the insulator 410 and the test soil 405 experience triboelectrification. The insulator 410 then changes polarity depending on the material of the insulator 410.

At position 405, the sensor has just been lifted from the test soil 405 and the polarity of the insulator 410 has been changed due to triboelectrification. The change in polarity of the insulator 410 causes a charge in the capacitor 305. The charge in the capacitor 305 is measured over time to determine the triboelectric properties of the test soil 405. Of course, the electrometer 115 is simultaneously using a plurality of sensors.

Figure 5:
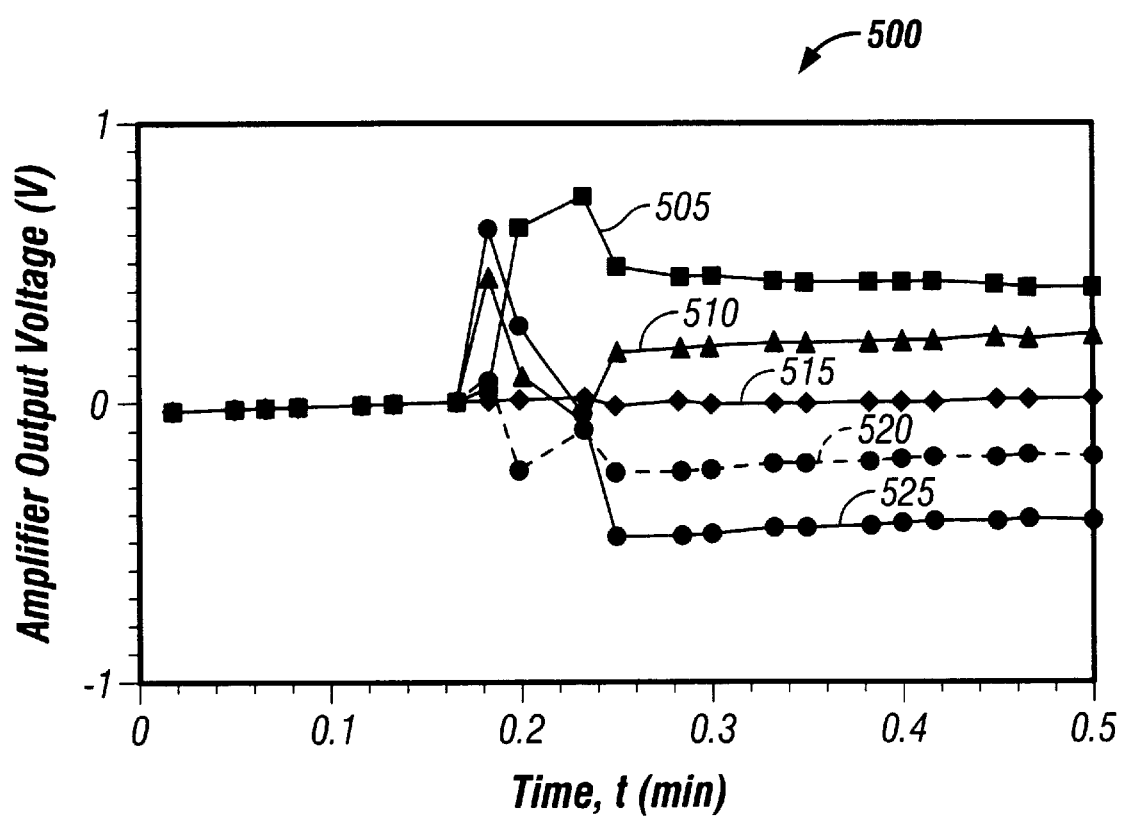
FIG. 5 illustrates experimental response curves from the array of sensors in the electrometer according to an embodiment of the present invention.

In an experimental test, the electrometer 115 was constructed using insulators of ABS, polycarbonate, linen filled phenolic, Rulon-J, and Teflon. The sensor array was then rubbed against wool felt at room temperature to obtain a triboelectric response. FIG. 5 illustrates experimental response curves 500 from the array of sensors in the electrometer according to the experimental setup. The curve 505 shows the response of the sensor having ABS as an insulator. The curve 510 shows the response of the sensor having polycarbonate as an insulator. The curve 515 shows the response of sensor having linen filled phenolic as an insulator. The curve 520 shows the response of the sensor having Rulon-J as an insulator. The curve 525 shows the response of the sensor having Teflon as an insulator.

The response at approximately 0.2 seconds is during the rubbing process. After secession of rubbing, the curves show a small loss of charge which indicates that these insulators have good insulating properties. In addition, the response show both positive, zero, and negative behavior. The zero behavior may be used to identify an important anti-static material. The voltage at the output of the amplifier had a gain of four with respect to the input.

By using the sensor array, a variety of insulating materials may be simultaneously tested to determine the triboelectric response of each material. By using the sensor array, a detailed picture of the static response of the test material may be obtained. This allows for the selection of materials to reduce the static electricity.

Numerous variations and modifications of the invention will become readily apparent to those skilled in the art. Accordingly, the invention may be embodied in other specific forms without departing from its spirit or essential characteristics.

What is claimed is:

1. A method of determining the triboelectric properties of a material comprising:

selecting a plurality of insulators;

simultaneously rubbing the plurality of insulators against the material;

measuring a change in a magnitude and polarity of an electrical charge on each of a plurality of the insulators over time; and determining a triboelectric property of the material in response to results from said measuring.

2. The method of claim 1, further comprising lifting the plurality of insulators from the material.

3. The method of claim 1, wherein the change in electrical charge is stored in a capacitor.

4. The method of claim 3, further comprising discharging the capacitor prior to the rubbing step.

5. The method of claim 4, wherein the capacitor is discharged using a switch.

6. The method of claim 5, wherein the switch is a low-leakage solid state switch.

* * * * *